United States Patent
Izawa et al.

(10) Patent No.: US 12,439,516 B2
(45) Date of Patent: Oct. 7, 2025

(54) OPTICAL APPARATUS

(71) Applicant: FURUKAWA ELECTRIC CO., LTD., Tokyo (JP)

(72) Inventors: Atsushi Izawa, Tokyo (JP); Kazuya Nagashima, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 308 days.

(21) Appl. No.: 18/332,078

(22) Filed: Jun. 9, 2023

(65) Prior Publication Data
US 2023/0319993 A1   Oct. 5, 2023

Related U.S. Application Data

(63) Continuation of application No. PCT/JP2021/047848, filed on Dec. 23, 2021.

(30) Foreign Application Priority Data

Dec. 24, 2020   (JP) ................................ 2020-214716

(51) Int. Cl.
*H05K 1/11* (2006.01)
*H01R 12/57* (2011.01)

(52) U.S. Cl.
CPC ............. *H05K 1/118* (2013.01); *H01R 12/57* (2013.01); *H05K 2201/10121* (2013.01)

(58) Field of Classification Search
CPC ......... H05K 1/118; H05K 2201/10121; H01R 12/57

(Continued)

(56) References Cited

U.S. PATENT DOCUMENTS

2006/0281361 A1   12/2006   Uchida et al.
2013/0048359 A1    2/2013   Ihara
(Continued)

FOREIGN PATENT DOCUMENTS

EP       0 704 730 A1    4/1996
JP       2004-221482 A   8/2004
(Continued)

OTHER PUBLICATIONS

International Search Report issued Mar. 1, 2022 in PCT/JP2021/047848 filed on Dec. 23, 2021, 3 pages.

*Primary Examiner* — Binh B Tran
(74) *Attorney, Agent, or Firm* — Oblon, McClelland, Maier & Neustadt, L.L.P.

(57) ABSTRACT

An optical apparatus includes: a housing; at least one component housed in the housing, the at least one component being configured to be energized and perform at least one of outputting light, receiving light, and changing a property of light; a plurality of external connection conductors configured to penetrate through the housing; and a flexible substrate housed in the housing, the flexible substrate including an insulation layer, a plurality of conductive wires each configured to perform at least one of conduction between the component and the external connection conductors, conduction between the external connection conductors, and conduction between a plurality of the components each serving as the at least one component, a base part in which the conductive wires are covered by the insulation layer, and a plurality of arm parts protruding and extending from the base part, each including one of the conductive wires.

9 Claims, 8 Drawing Sheets

(58) Field of Classification Search
USPC .......................................................... 361/749
See application file for complete search history.

(56) References Cited

U.S. PATENT DOCUMENTS

2014/0131071 A1    5/2014  Tanaka et al.
2021/0393870 A1*  12/2021  Kessel .............. A61M 5/14244

FOREIGN PATENT DOCUMENTS

| JP | 2004-335548 A | 11/2004 |
| JP | 2005-195963 A | 7/2005 |
| JP | 2006-110557 A | 4/2006 |
| JP | 2012-49297 A | 3/2012 |
| JP | 2013-48031 A | 3/2013 |
| JP | 2014-116286 A | 6/2014 |
| JP | 2017-157498 A | 9/2017 |
| JP | 2020-35774 A | 3/2020 |

* cited by examiner

OPTICAL APPARATUS

This application is a continuation of International Application No. PCT/JP2021/047848, filed on Dec. 23, 2021 which claims the benefit of priority of the prior Japanese Patent Application No. 2020-214716, filed on Dec. 24, 2020, the entire contents of which are incorporated herein by reference.

BACKGROUND

The present disclosure relates to an optical apparatus.

In the related art, an optical apparatus in which a flexible substrate is housed in a housing has been known as an optical apparatus (for example, Japanese Patent Application Laid-open No. 2004-221482). The flexible substrate has an insulation layer and a plurality of conductive wires.

SUMMARY

In Japanese Patent Application Laid-open No. 2004-221482, an insulation layer is interposed between two conductive wires adjacent to each other on the flexible substrate, over almost the entire section of the conductive wires in the longitudinal direction. Therefore, for example, when the flexible substrate becomes difficult to be bent, or when the position of each terminal of a component is shifted in the thickness direction of the flexible substrate, there may occur an inconvenience such that the connection between the terminal and the conductive wire of the flexible substrate becomes difficult.

There is a need for an optical apparatus in which a flexible substrate is housed in a housing, and that has a novel and improved configuration.

According to one aspect of the present disclosure, there is provided an optical apparatus including: a housing; at least one component housed in the housing, the at least one component being configured to be energized and perform at least one of outputting light, receiving light, and changing a property of light; a plurality of external connection conductors configured to penetrate through the housing; and a flexible substrate housed in the housing, the flexible substrate including an insulation layer, a plurality of conductive wires each configured to perform at least one of conduction between the component and the external connection conductors, conduction between the external connection conductors, and conduction between a plurality of the components each serving as the at least one component, a base part in which the conductive wires are covered by the insulation layer, and a plurality of arm parts protruding and extending from the base part, each including one of the conductive wires.

DETAILED DESCRIPTION

Figure 1:
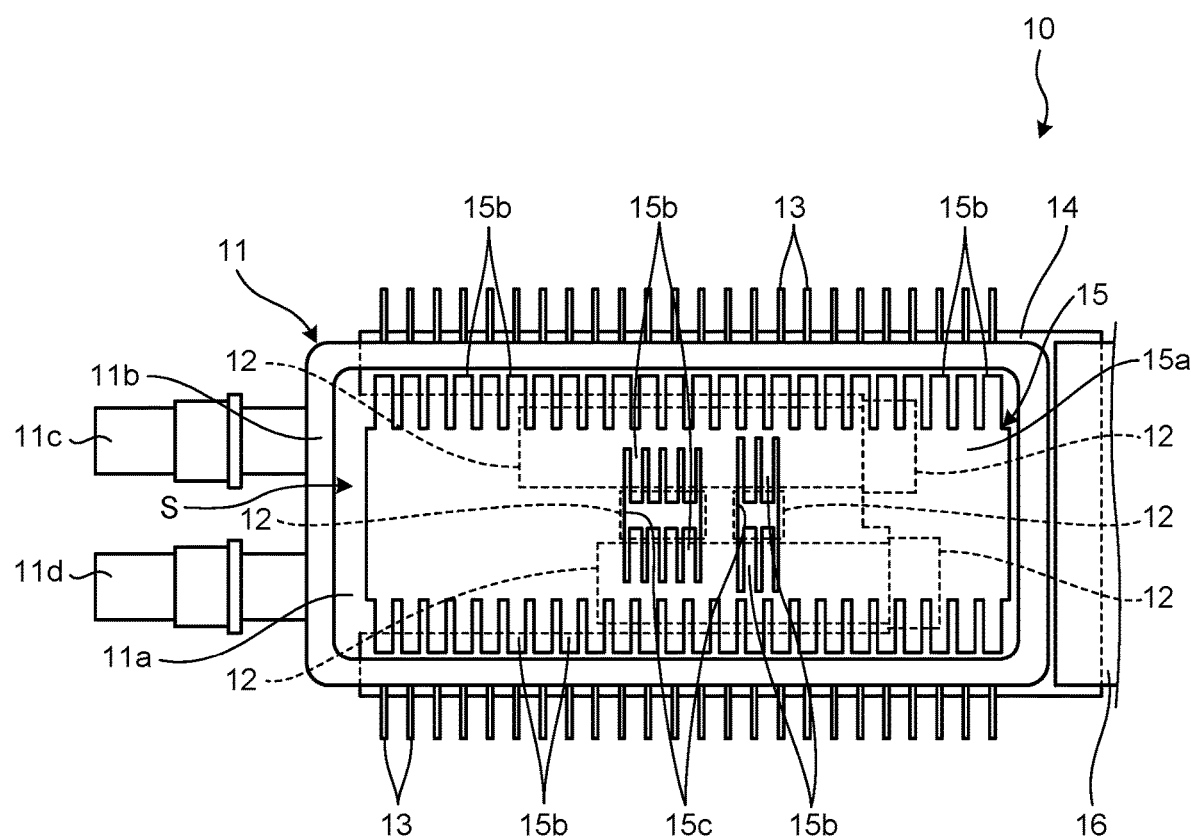
FIG. 1 is an exemplary and schematic plan view illustrating an internal configuration of an optical apparatus of a first embodiment.
Figure 1:
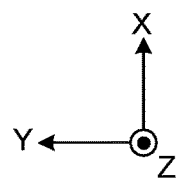

Hereinafter, exemplary embodiments of the present disclosure will be disclosed. The configurations of the embodiments described below, and the actions and results (effects) brought about by the configurations are merely examples. The present disclosure can also be implemented by configurations other than those disclosed in the following embodiments. Moreover, according to the present disclosure, it is possible to obtain at least one of various effects (including derivative effects) obtained by the configurations.

The embodiments described below have similar configurations. Thus, according to the configuration of each embodiment, it is possible to obtain the same actions and effects based on the similar configuration. Moreover, in the following, the same reference numerals denote the same components, and the repeated description thereof may be omitted.

In the present specification, ordinal numbers are given for convenience to distinguish members, portions, directions, and the like, and are not intended to indicate priority or order.

Moreover, in each drawing, the X direction is represented by an arrow X, the Y direction is represented by an arrow Y, and the Z direction is represented by an arrow Z. The X direction, the Y direction, and the Z direction intersect with each other and are orthogonal to each other.

First Embodiment

FIG. 1 is a plan view illustrating an internal configuration of an optical apparatus 10. FIG. 1 is a diagram of the optical apparatus 10 viewed in the opposite direction to the Z direction, in a state in which a flat lid (not illustrated) located at an end portion in the Z direction of a housing 11 of the optical apparatus 10 is removed.

As illustrated in FIG. 1, the optical apparatus 10 includes the housing 11, a plurality of components 12, a plurality of external connection pins 13, a feedthrough 14, a flexible substrate 15, and a connection substrate 16.

The housing 11 has a bottom wall 11a, a peripheral wall 11b, ports 11c and 11d, and a lid (not illustrated). The bottom wall 11a has a substantially rectangular shape and also a plate-like shape. The bottom wall 11a intersects the Z direction, and extends in the X direction and the Y direction. The peripheral wall 11b extends from an edge of the bottom wall 11a in the Z direction at a substantially constant thickness. The peripheral wall 11b may also be referred to as a side wall.

Similar to the bottom wall 11a, the lid of the housing 11 has a substantially rectangular shape and also a plate-like shape. The peripheral edge of the lid overlaps in the Z direction with an end edge of the peripheral wall 11b in the Z direction. By joining the peripheral edge of the lid to the end edge of the peripheral wall 11b in the Z direction, a housing chamber S is formed in the housing 11 to accommodate the components 12, the flexible substrate 15, and the like. The housing chamber S is hermetically sealed. The housing chamber S may also be filled with inert gas.

For example, the bottom wall 11a can be made of a material with high thermal conductivity, such as copper-tungsten (CuW), copper-molybdenum (CUMo), and aluminum oxide ($Al_2O_3$). Moreover, for example, the peripheral wall 11b and the lid can be made of a material with a low thermal expansion coefficient such as Fe—Ni—Co alloy and aluminum oxide ($Al_2O_3$).

The ports 11c and 11d each have a cylindrical shape, and protrude from a part of the peripheral wall 11b in a lateral direction, that is, in the Y direction in the example of FIG. 1. One of the ports 11c and 11d is an input port, and the other is an output port. An input optical fiber penetrates through the input port, and an output optical fiber penetrates through the output port. The space between the ports 11c and 11d and the peripheral wall 11b, and the space between the ports 11c and 11d and the respective optical fibers are hermetically sealed.

The components 12 are housed in the housing chamber S, that is, in the housing 11. The components 12 are mounted on the bottom wall 11a, or on a cooling mechanism (not illustrated) provided on the bottom wall 11a. The components 12 are energized from outside the housing 11, that is, receive power supply from outside the housing 11, and perform at least one of outputting light, receiving (detecting) light, and changing properties such as optical intensity, wavelength, modulation frequency, polarization state, and interference state. The components 12 are optical components that are electrically operated, and electrical components. For example, such components 12 include a chip-on-submount (light emitting unit), a wavelength locker serving as a wavelength detector, a photodiode serving as a photodetector, a photodiode array, a modulator, a modulator driver, a coherent mixer, a transimpedance amplifier, a heater (heating mechanism), a thermoelectric cooler (TEC, cooling mechanism), and the like. For example, the housing chamber S also houses optical components that are not electrically operated such as a lens, a mirror, a beam combiner, a beam splitter, and an optical isolator (not illustrated).

The external connection pins 13 are attached to the housing 11 or the feedthrough 14. All of the external connection pins 13 extend in the X direction, and are aligned in the Y direction with a gap therebetween. Moreover, in the present embodiment, one array in which the external connection pins 13 are aligned in the Y direction, is provided along a portion (side wall) of the peripheral wall 11b that is located on the end portion in the X direction and that extends in the Y direction. Another array in which the external connection pins 13 are aligned in the Y direction, is provided along a portion (side wall) of the peripheral wall 11b that is located on the end portion in the opposite direction to the X direction and that extends in the Y direction. For example, the external connection pins 13 can be made of a highly conductive metallic material such as copper-based metal or aluminum-based metal. The copper-based metal is copper and copper alloy, and the aluminum-based metal is aluminum and aluminum alloy. Each of the external connection pins 13 is mechanically and electrically connected to a conductor of external wiring (not illustrated). Moreover, each of the external connection pins 13 is electrically connected to a conductive wire (not illustrated) of the flexible substrate 15 in the housing 11, via a conductor (not illustrated) provided in the feedthrough 14.

The feedthrough 14 has a conductor and an insulation part, and penetrates through the peripheral wall 11b of the housing 11. For example, the conductor of the feedthrough 14 can be made of a highly conductive metallic material such as copper-based metal. Each conductor of the feedthrough 14 forms an external connection conductor with the electrically connected external connection pin 13. Moreover, for example, the insulation part of the feedthrough 14 can be made of an insulator such as ceramics. The boundary between the feedthrough 14 and the housing 11 is hermetically sealed.

The flexible substrate 15 is housed in the housing chamber S. The flexible substrate 15 expands and intersects the Z direction, and extends in the X direction and the Y direction. The thickness direction of the flexible substrate 15 is substantially in the Z direction. In the housing chamber S, the flexible substrate 15 is located on the opposite side of the bottom wall 11a, with respect to the components 12 and the portions of the feedthrough 14 which are in the housing chamber S. In other words, the flexible substrate 15 covers the components 12 and a part of the feedthrough 14 in the Z direction.

For example, the flexible substrate 15 is a flexible printed circuit board (FPC), that is, a single-sided FPC. The flexible substrate 15 has an insulation layer (not illustrated) and a plurality of conductive wires (not illustrated). For example, the insulation layer is made of an insulating synthetic resin material such as polyimide. Moreover, the insulation layer has a portion interposed between the conductive wires, and a portion that covers the conductive wires. Each of the conductive wires has a relatively thin belt-like shape. For example, the conductive wire is made of a highly conductive metallic material such as copper-based metal. Moreover, each of the conductive wires electrically connects the external connection pin 13 and the conductor of the feedthrough 14 with a terminal or electrode (not illustrated) of the component 12.

The flexible substrate 15 has a base part 15a and a plurality of arm parts 15b. As illustrated in FIG. 1, in a plan view when viewed in the opposite direction to the Z direction, each of the arm parts 15b protrudes from the edge (external edge) of the outer periphery of the base part 15a, or from the edge (inner edge) of each opening 15c provided in the base part 15a. The arm part 15b has a belt-like shape and also a strip shape. In the example of FIG. 1, the opening 15c is a through hole that penetrates through the flexible substrate 15 in the Z direction. However, it is not limited thereto, and for example, the opening 15c may also be a notch formed by notching the outer peripheral edge of the base part 15a of the flexible substrate 15.

Moreover, in the example of FIG. 1, when viewed in the opposite direction to the Z direction, the arm parts 15b extend in the X direction, and are aligned in the Y direction with a gap therebetween. The X direction can also be referred to as an extending direction of the arm parts 15b, and the Y direction can also be referred to as an aligning direction of the arm parts 15b. The Z direction and the opposite direction to the Z direction are each an example of the thickness direction of the flexible substrate 15. The X direction is an example of a first direction, and the Y direction is an example of a second direction. The extending direction of the arm parts 15b can be any direction that intersects the thickness direction of the flexible substrate 15, and is not limited to the X direction. Moreover, the aligning direction of the arm parts 15b can be any direction that intersects the extending direction of the arm parts 15b, and is not limited to the Y direction.

For example, the connection substrate 16 is a flexible substrate, a rigid substrate, or the like. The connection substrate 16 includes an insulation part (not illustrated) and a plurality of conductive wires (not illustrated). Each of the conductive wires of the connection substrate 16 is electrically connected to the conductor of the feedthrough 14.

In the configuration described above, for example, direct current electric power or a relatively low-frequency electrical signal is transmitted between the external connection pins 13 and the components 12, via the conductor of the feedthrough 14 and the conductive wires of the flexible substrate 15. On the other hand, a relatively high-frequency electrical signal (RF signal) is transmitted between the conductive wires of the connection substrate 16 and the components 12, via the conductor of the feedthrough 14 and the conductive wires of the flexible substrate 15.

Figure 2:
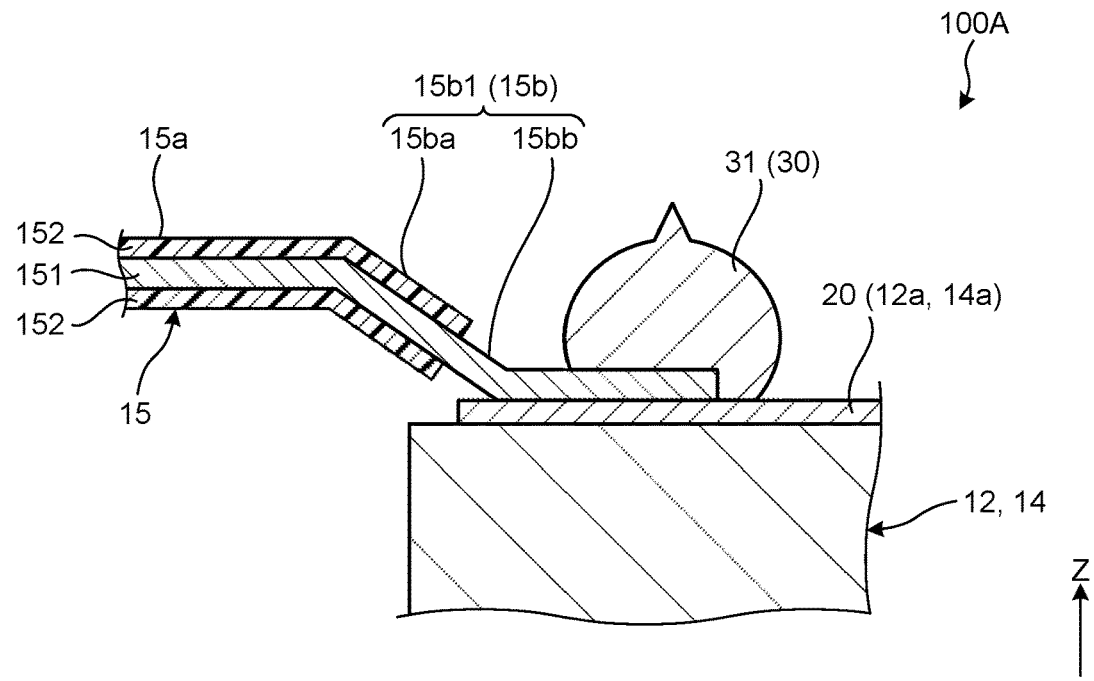
FIG. 2 is an exemplary and schematic sectional view of a part of the optical apparatus of the first embodiment.

FIG. 2 is a sectional view of a part of the optical apparatus 10 as well as a sectional view of a connection structure 100A. In the connection structure 100A, a conductive wire 151 of the flexible substrate 15 and a conductor part 20 of the component 12 or the feedthrough 14 are mechanically and electrically connected, via a conductive bonding material 31 (30). The conductor part 20 is a terminal 12a (electrode) of the component 12 or a conductor 14a of the feedthrough 14. For example, the terminal 12a can be made of a highly conductive metallic material such as copper-based metal. The conductor 14a is an example of an external connection conductor.

FIG. 2 illustrates the connection structure 100A at each of one end and the other end of the conductive wire 151 of the flexible substrate 15 in the longitudinal direction. That is, the one end of the conductive wire 151 in the longitudinal direction is connected to one of the terminal 12a of the component 12 and the conductor 14a of the feedthrough 14, by the connection structure 100A. Moreover, the other end of the conductive wire 151 in the longitudinal direction is connected to one of the terminal 12a and the conductor 14a, by the connection structure 100A. Thus, each conductive wire 151 implements one of (1) conduction between the terminal 12a and the conductor 14a, (2) conduction between a plurality of the conductors 14a, and (3) conduction between a plurality of the terminals 12a.

As illustrated in FIG. 2, the flexible substrate 15 has the conductive wire 151 and an insulation layer 152. The insulation layer 152 covers both sides of the conductive wire 151 in the Z direction.

Figure 3:
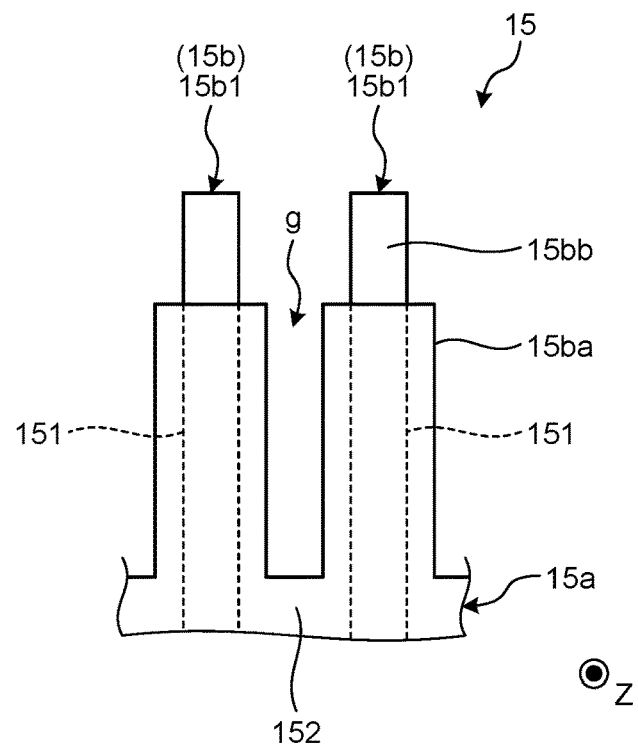
FIG. 3 is an exemplary and schematic plan view of a part of a flexible substrate of the first embodiment.

FIG. 3 is a plan view of the flexible substrate 15 before being incorporated into the optical apparatus 10. As illustrated in FIG. 3, in the present embodiment, each arm part 15b has one (and only one) conductive wire 151. A gap g is provided between the arm parts 15b adjacent to each other. The gap g can also be referred to as a slit.

As illustrated in FIGS. 2 and 3, an arm part 15b1 (15b) has a covered section 15ba in which the conductive wire 151 is covered by the insulation layer 152, and an exposed section 15bb in which the conductive wire 151 is exposed without being covered by the insulation layer 152. In the covered section 15ba, the insulation layer 152 surrounds the conductive wire 151. The arm part 15b1 is an example of a first arm part.

Moreover, as illustrated in FIG. 2, in the connection structure 100A of the present embodiment, the tip end portion of the exposed section 15bb is placed on the conductor part 20 in a substantially contact manner, and the tip end portion and the conductor part 20 are mechanically joined by the bonding material 31 (30), and are electrically connected. The bonding material 31 covers the tip end portion of the exposed section 15bb, and is placed on the conductor part 20. For example, the bonding material 31 is a bump or ball made of a conductive metallic material such as gold, copper, silver, solder, or brazing metal, and is an example of a conductive bonding material. The connection structure 100A with such a bonding material 31 can be made by ultrasonic bonding using a wire bonder or by soldering, brazing, or the like using a heating tool.

As described above, in the present embodiment, the flexible substrate 15 has the base part 15a and the arm parts 15b that protrude and extend from the base part 15a, and that each include one conductive wire 151.

With such a configuration, for example, compared to a configuration in which the arm part 15b includes a plurality of the conductive wires 151, or in other words, a configuration in which the insulation layer 152 is interposed between two adjacent conductive wires 151, the arm part 15b can be bent more easily. Hence, an operator or a robot can advantageously perform the bonding operation of the conductive wire 151 and the conductor part 20 more easily, faster, or with more certainty.

Moreover, impedance can be easily matched by the specifications such as the width, thickness, length, and shape of the conductive wire 151, and eventually, it is possible to advantageously suppress the reflection loss of high-frequency signals.

Furthermore, as in the present embodiment, when viewed in the opposite direction to the Z direction (thickness direction of the flexible substrate 15), the flexible substrate 15 may include the arm parts 15b that extend in the X direction and that are aligned in the Y direction with the gap g therebetween.

With such a configuration, for example, an operator or a robot can perform an operation of mechanically and electrically connecting the conductive wire 151 to each of the conductors 14a (external connection conductor, conductor part 20) aligned in the Y direction with a gap therebetween, more easily or faster.

Second Embodiment

Figure 4:
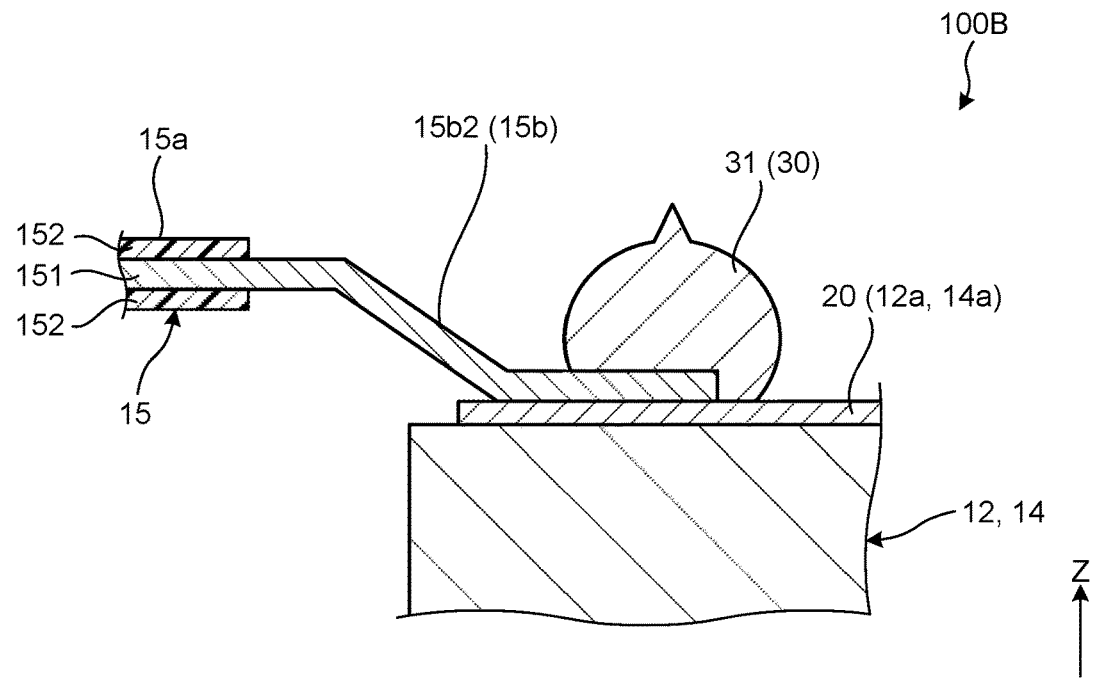
FIG. 4 is an exemplary and schematic sectional view of a part of an optical apparatus of a second embodiment.
Figure 5:
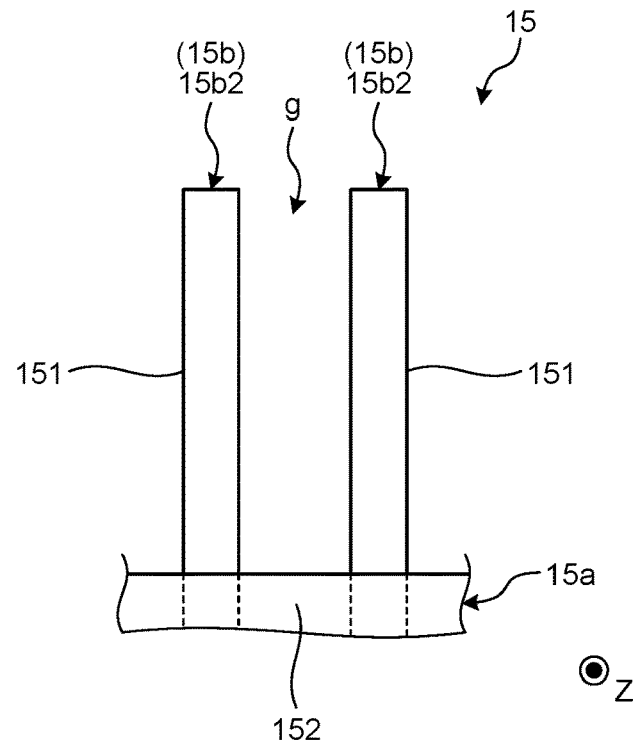
FIG. 5 is an exemplary and schematic plan view of a part of a flexible substrate of the second embodiment.

FIG. 4 is a sectional view of a connection structure 100B of a second embodiment. Moreover, FIG. 5 is a plan view of the flexible substrate 15 of the present embodiment before being incorporated into the optical apparatus 10. The connection structure 100B of FIG. 4 and the flexible substrate 15 of FIG. 5 can be incorporated into the optical apparatus 10 in place of the connection structure 100A and the flexible substrate 15 of the first embodiment.

As is apparent from FIGS. 4 and 5, in the present embodiment, the conductive wire 151 is exposed in the entire section of an arm part 15b2 (15b) without being covered by the insulation layer 152. That is, the arm part 15b2 protrudes from the base part 15a in a direction intersecting the Z direction without being covered by the insulation layer 152. Other than this point, the connection structure 100B has the same configuration as that of the connection structure 100A. The arm part 15b2 is an example of a second arm part.

With such a configuration, for example, the arm part 15b2 can be bent more easily. Hence, an operator or a robot can advantageously perform the bonding operation of the conductive wire 151 and the conductor part 20 more easily or faster.

Third Embodiment

Figure 6:
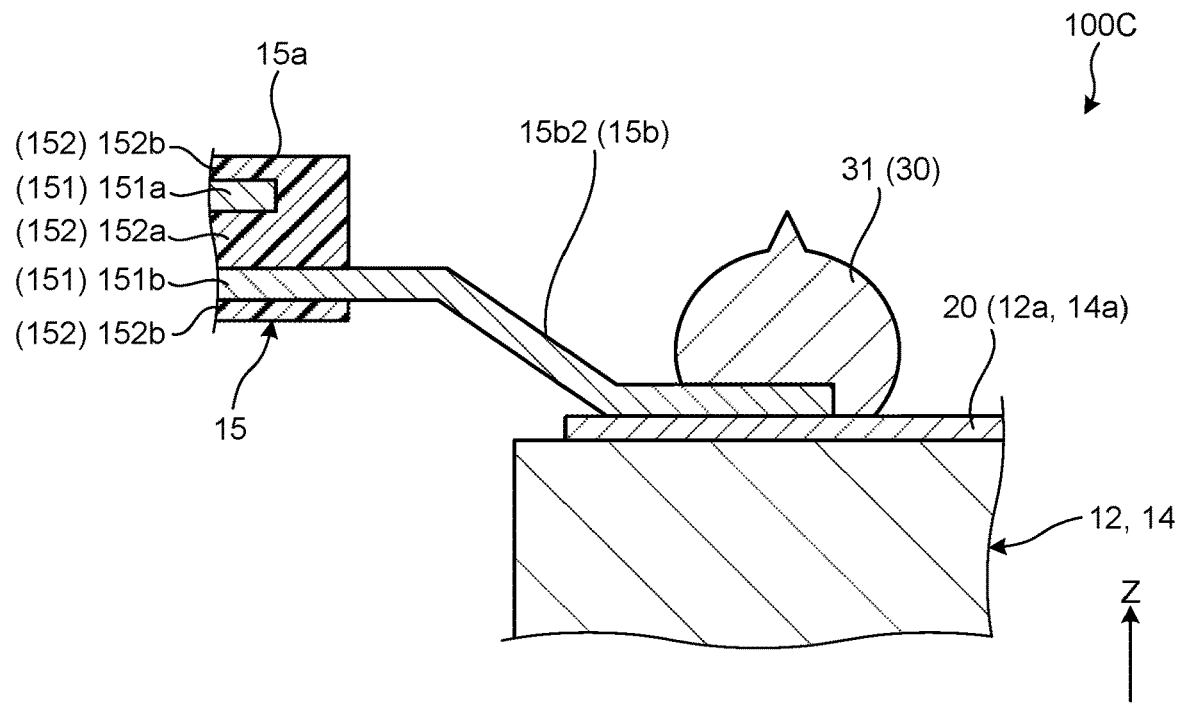
FIG. 6 is an exemplary and schematic sectional view of a part of an optical apparatus of a third embodiment.

FIG. 6 is a sectional view of a connection structure 100C of a third embodiment. The connection structure 100C of FIG. 6 can be incorporated into the optical apparatus 10 in place of the connection structure 100A of the first embodiment.

In the present embodiment, the configuration of the flexible substrate 15 differs from that of the embodiments described above. The flexible substrate 15 has a plurality of multi-layered conductive wires 151. For example, the flexible substrate 15 is a double-sided FPC. The flexible substrate 15 of FIG. 6 has two conductive wires 151 separated from each other in the thickness direction, an insulation layer 152a interposed between the two conductive wires 151, and an insulation layer 152b that covers the conductive wires 151 outside in the thickness direction. The two conductive wires 151 separated from each other in the thickness direction may also be electrically connected via a through hole, which is not illustrated.

In the present embodiment, of the two conductive wires 151, the conductive wire 151 on the side close to the conductor part 20 in the Z direction is mechanically and electrically connected to the conductor part 20 via the bonding material 31. Even with such a configuration, it is possible to obtain the same effects as those in the embodiments described above.

Fourth Embodiment

Figure 7:
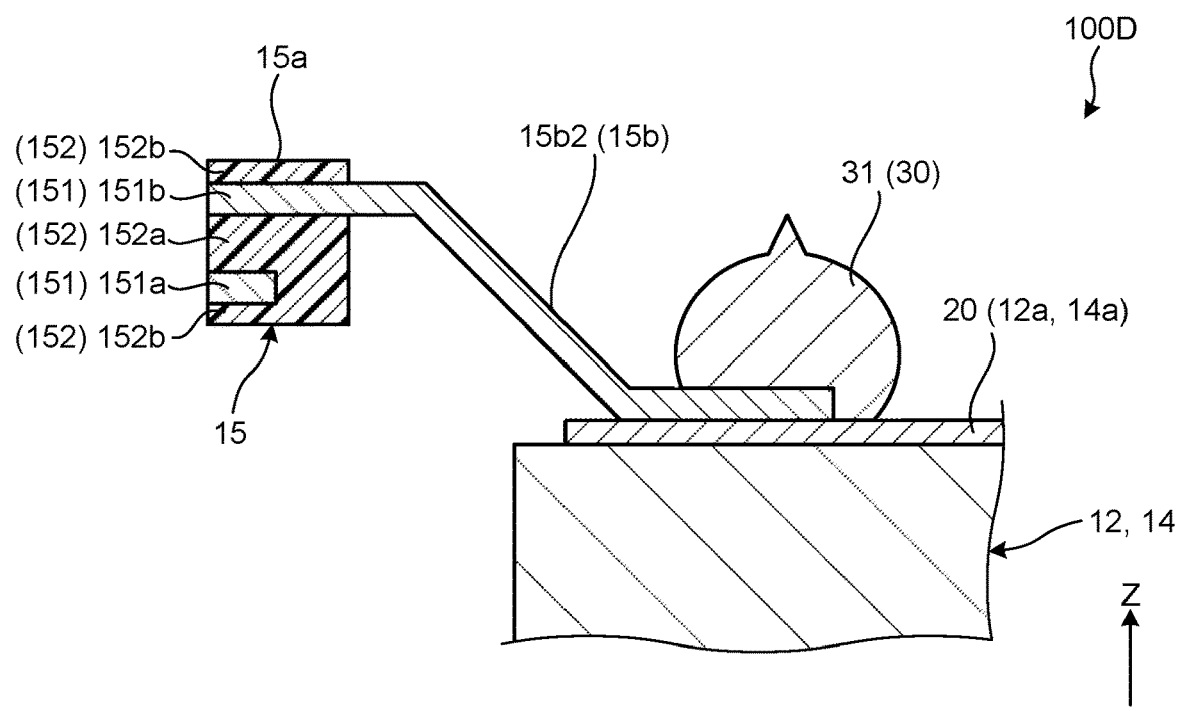
FIG. 7 is an exemplary and schematic sectional view of a part of an optical apparatus of a fourth embodiment.

FIG. 7 is a sectional view of a connection structure 100D of a fourth embodiment. The connection structure 100D of FIG. 7 can be incorporated into the optical apparatus 10 in place of the connection structure 100A of the first embodiment.

In the present embodiment, the configuration of the flexible substrate 15 is the same as that of the third embodiment. However, in the present embodiment, of the two conductive wires 151, the conductive wire 151 on the side far away from the conductor part 20 in the Z direction is mechanically and electrically connected to the conductor part 20 via the bonding material 31. Even with such a configuration, it is possible to obtain the same effects as those in the embodiments described above.

Moreover, as is apparent from FIG. 6 of the third embodiment and FIG. 7 of the present embodiment, even when the flexible substrate 15 with the multi-layered conductive wires 151 is incorporated into the optical apparatus 10, the arm part 15b can be independently and easily bent for each conductive wire 151, and the connection state between the conductive wire 151 and the conductor part 20 can be easily established regardless of the position of the conductive wire 151 in the Z direction. Hence, an operator or a robot can advantageously perform the bonding operation of the conductive wire 151 and the conductor part 20 more easily or faster. The optical apparatus 10 may also include both the connection structures 100C and 100D of FIGS. 6 and 7. Moreover, the arm part 15b may be the arm part 15b1 as in the first embodiment, or the flexible substrate 15 may include both the arm part 15b1 as in the first embodiment and the arm part 15b2 as in the second embodiment.

Fifth Embodiment

Figure 8:
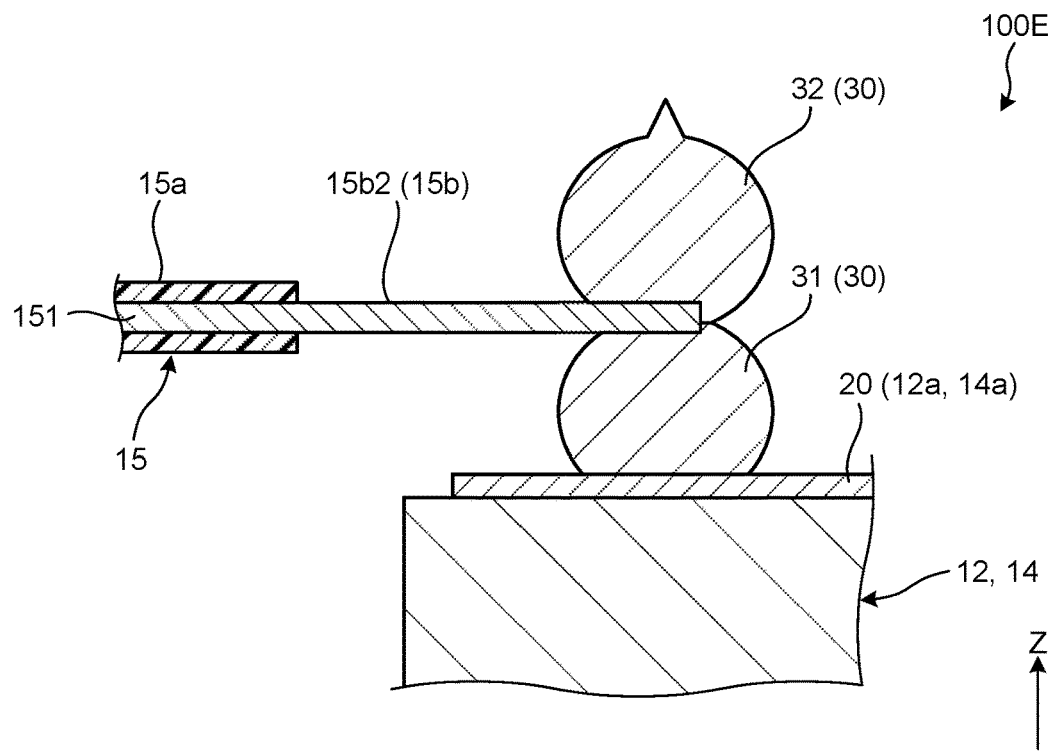
FIG. 8 is an exemplary and schematic sectional view of a part of an optical apparatus of a fifth embodiment.

FIG. 8 is a sectional view of a connection structure 100E of a fifth embodiment. The connection structure 100E of FIG. 8 can be incorporated into the optical apparatus 10 in place of the connection structure 100A of the first embodiment.

In the present embodiment, the conductive wire 151 of the arm part 15b and the conductor part 20 are mechanically and electrically connected via two bonding materials 31 and 32 (30).

For example, the bonding material 32 is a bump or ball made of a conductive metallic material such as gold, copper, silver, solder, or brazing metal, and is an example of a conductive bonding material.

The bonding material 31 is interposed between the conductive wire 151 and the conductor part 20. Moreover, the bonding material 32 is mechanically and electrically connected to the bonding material 31 in a partial manner, and covers the conductive wire 151 on the opposite side of the bonding material 31 with respect to the conductive wire 151. That is, in the present embodiment, the conductive wire 151 is sandwiched between the two bonding materials 31 and 32 in the Z direction, and the periphery of the tip end portion of the conductive wire 151 is covered by the two bonding materials 31 and 32. With such a configuration, for example, it is possible to, advantageously, more firmly connect the conductive wire 151 with the conductor part 20. Furthermore, for example, it is possible to reduce the bending amount of the conductive wire 151 by the bonding material 31, suppress an increase in the stress of the conductive wire 151, and eventually, advantageously, further improve the reliability of the connection structure 100E.

Sixth Embodiment

Figure 9:
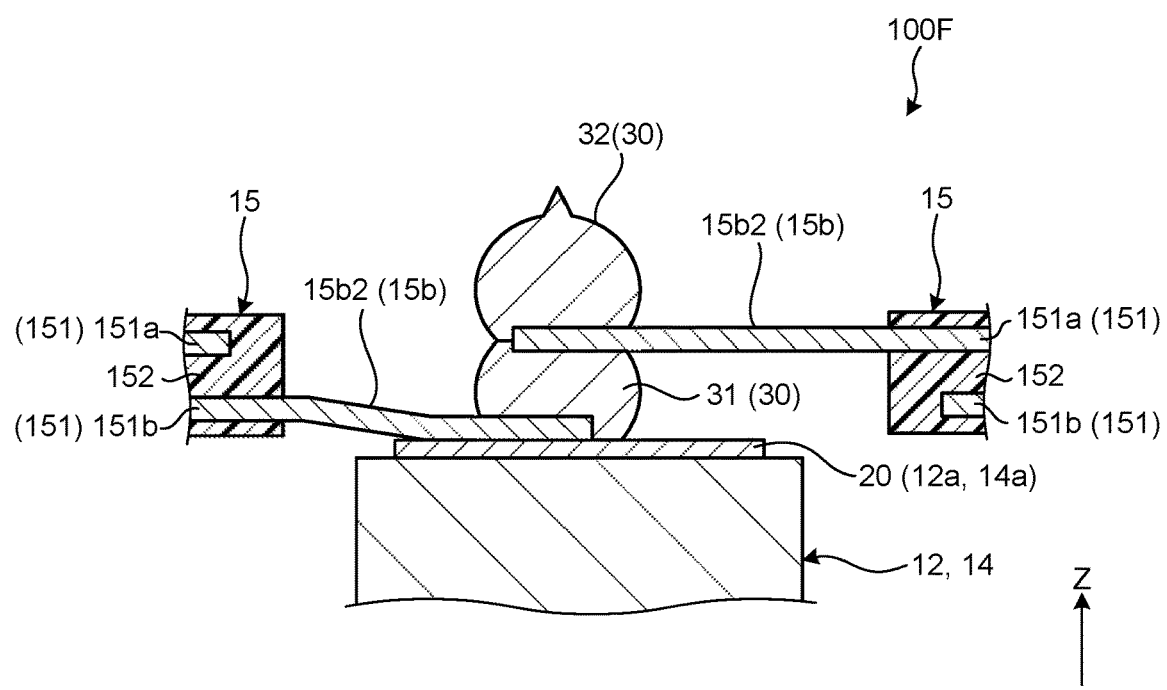
FIG. 9 is an exemplary and schematic sectional view of a part of an optical apparatus of a sixth embodiment.

FIG. 9 is a sectional view of a connection structure 100F of a sixth embodiment. The connection structure 100F of FIG. 9 can be incorporated into the optical apparatus 10 in place of the connection structure 100A of the first embodiment.

In the present embodiment, the configuration of the flexible substrate 15 is the same as that of the third embodiment and the fourth embodiment. However, in the present embodiment, a conductive wire 151a of the arm part 15b and a conductive wire 151b of another arm part 15b are mechanically and electrically connected to one conductor part 20. Moreover, in the present embodiment, the two conductive wires 151a and 151b of the respective flexible substrates 15 are mechanically and electrically connected to one conductor part 20.

The conductive wires 151a and 151b are mechanically and electrically connected to the conductor part 20 via the two bonding materials 31 and 32. Specifically, similar to the first embodiment (see FIG. 2), the conductive wire 151b is mechanically and electrically connected to the conductor part 20 in a state in which the conductive wire 151b is sandwiched between the conductor part 20 and the bonding material 31. Moreover, similar to the fifth embodiment (see FIG. 8), the conductive wire 151a is mechanically and electrically connected to the conductor part 20 in a state in which the conductive wire 151a is sandwiched between the two bonding materials 31 and 32. Furthermore, of the two conductive wires 151a and 151b, the conductive wire 151b close to the conductor part 20 in the Z direction is in contact with the conductor part 20, and the bonding material 31 is interposed between the conductor part 20 and the conductive wire 151a far away from the conductor part 20 in the Z direction. Hence, the bending amount of the arm part 15b becomes smaller. Consequently, for example, it is possible to suppress an increase in the stress of the conductive wires 151a and 151b, and eventually, advantageously, further improve the reliability of the connection structure 100F.

With such a configuration, for example, a through hole that electrically connects between the conductive wires 151a and 151b becomes unnecessary, and the configuration of the flexible substrate 15 can be more simplified. Hence, it is possible to advantageously reduce the manufacturing labor and costs.

Seventh Embodiment

Figure 10:
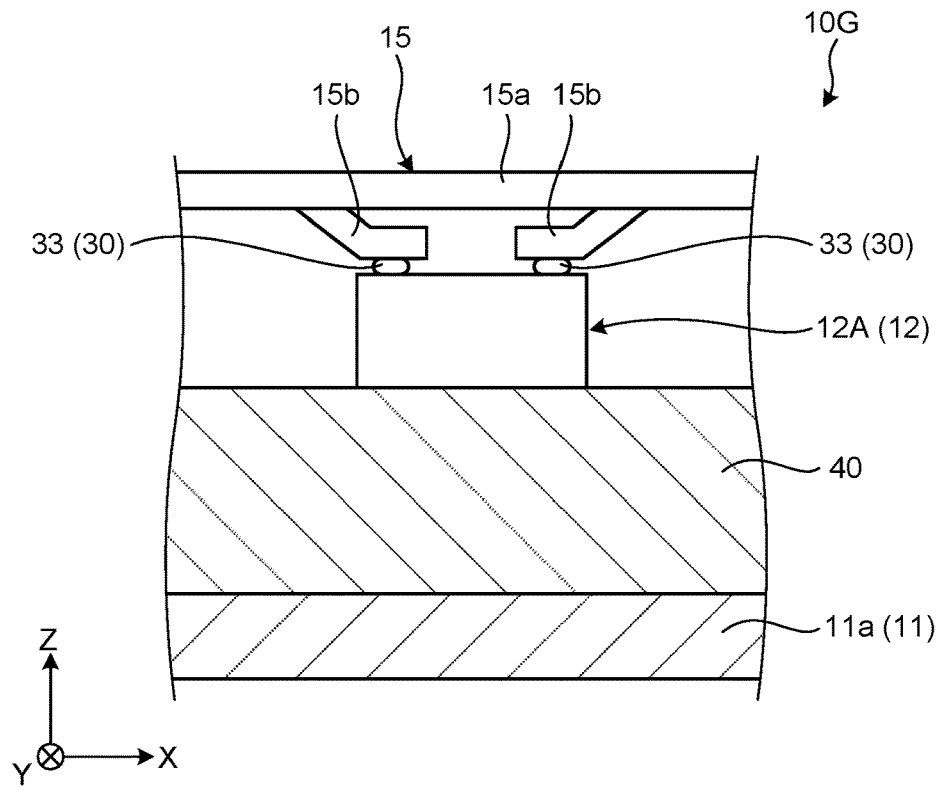
FIG. 10 is an exemplary and schematic sectional view (partial side view) of a part of an optical apparatus of a seventh embodiment.
Figure 11:
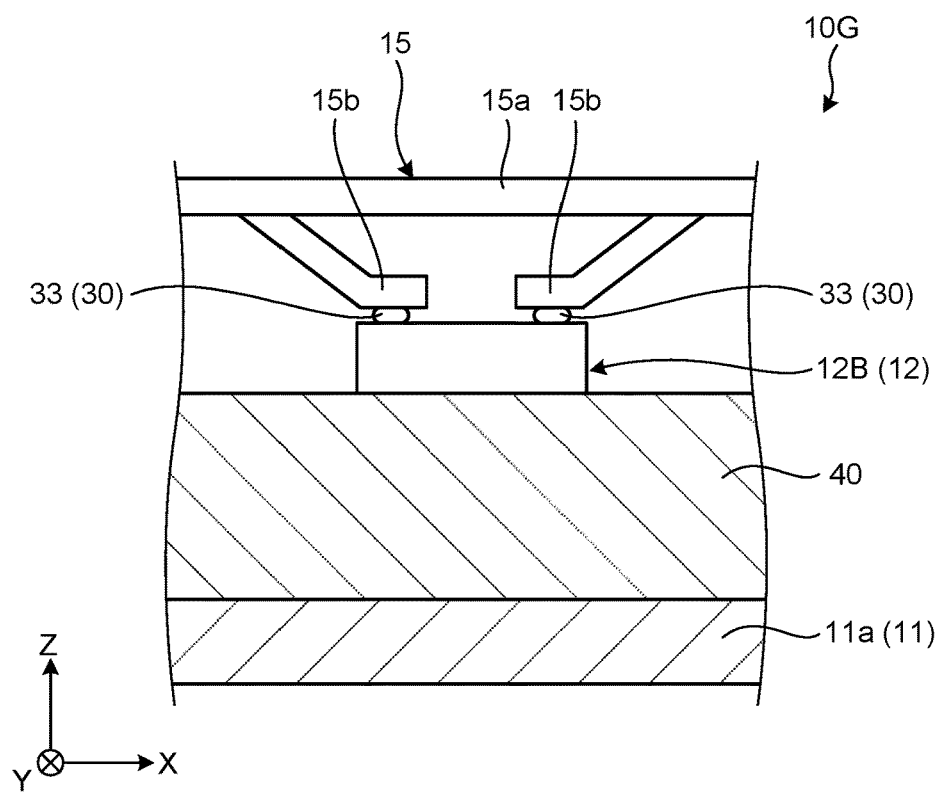
FIG. 11 is an exemplary and schematic sectional view (partial side view) of another part of the optical apparatus of the seventh embodiment.

FIGS. 10 and 11 are sectional views (partial side views) of an optical apparatus 10G of a seventh embodiment. As illustrated in FIGS. 10 and 11, the optical apparatus 10G includes components 12A and 12B (12) that are mounted on a cooling mechanism 40, the components 12A and 12B (12) having different lengths (heights) in the Z direction. The cooling mechanism 40 is a TEC, and is mounted on the bottom wall 11a.

As is apparent from FIGS. 10 and 11, in the present embodiment, the length of the arm part 15b of the flexible substrate 15 corresponding to the component 12A the length of which is relatively long in the Z direction, that is, with a relatively tall height, is relatively short. Also, the length of the arm part 15b corresponding to the component 12B the length of which is relatively short in the Z direction, that is, with a relatively short height, is relatively long.

If the lengths of the arm parts 15b individually corresponding to the components 12 with different heights are the same, and if the position of the base part 15a in the Z direction is the same, the bending amount of the conductive wire 151 included in the arm part 15b corresponding to the relatively short component 12B becomes larger than the bending amount of the conductive wire 151 included in the arm part 15b corresponding to the relatively tall component 12A. Hence, the stress may be increased more. Moreover, in order to prevent such a situation, if the distances between the components 12 and the base part 15a in the Z direction are made to be equal, the position of the base part 15a in the Z direction needs to be changed locally. Hence, the support structure for supporting the flexible substrate 15 becomes complicated.

In this regard, according to the present embodiment, as described above, the length of the arm part 15b differs corresponding to the components 12A and 12B with different heights in the Z direction. Hence, it is possible to install the flexible substrate 15 in the housing chamber S, that is, in the housing 11, while suppressing an increase in the stress of the conductive wire 151 as described above, and without greatly changing or hardly changing the position of the base part 15a in the Z direction. Consequently, for example, it is possible to advantageously suppress an increase in the stress of the conductive wire 151, and compared to the configuration in which the position of the base part 15a in the Z direction is changed in accordance with the height of the component 12, it is possible to, advantageously, further simplify the support structure of the flexible substrate 15 in the optical apparatus 10.

Figure 12:
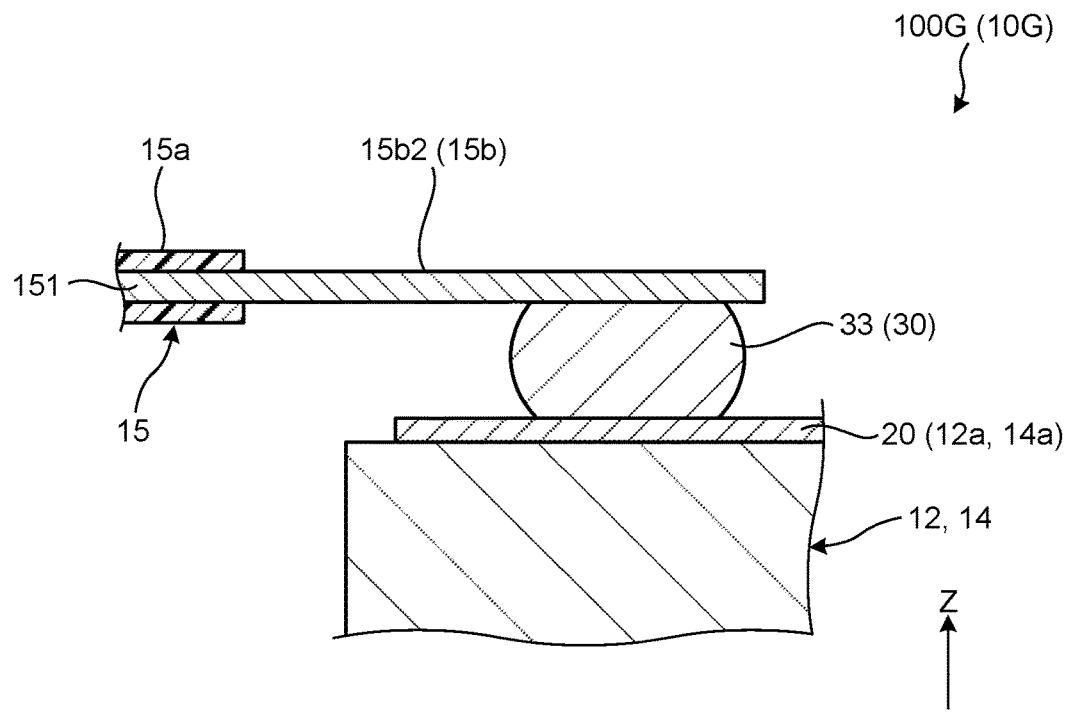
FIG. 12 is an exemplary and schematic sectional view of a part of the optical apparatus of the seventh embodiment.

Moreover, FIG. 12 is a sectional view of a connection structure 100G of the present embodiment. As illustrated in FIG. 12, in the present embodiment, a bonding material 33 (30) is interposed between the conductive wire 151 and the conductor part 20. For example, the bonding material 33 is solder, and by being heated and melted by a heating tool and by being naturally cooled and solidified, the bonding material 33 mechanically and electrically connects the conductive wire 151 and the conductor part 20. For example, the bonding material 33 is a bump or ball made of a conductive metallic material such as gold, copper, silver, solder, or brazing metal, and is an example of a conductive bonding material. Even with such a configuration, it is possible to obtain the same effects as those in the embodiments described above. In the optical apparatus 10G of the present embodiment, each of the connection structures 100A to 100F of the embodiments described above can also be incorporated in place of the connection structure 100G.

Eighth Embodiment

Figure 13:
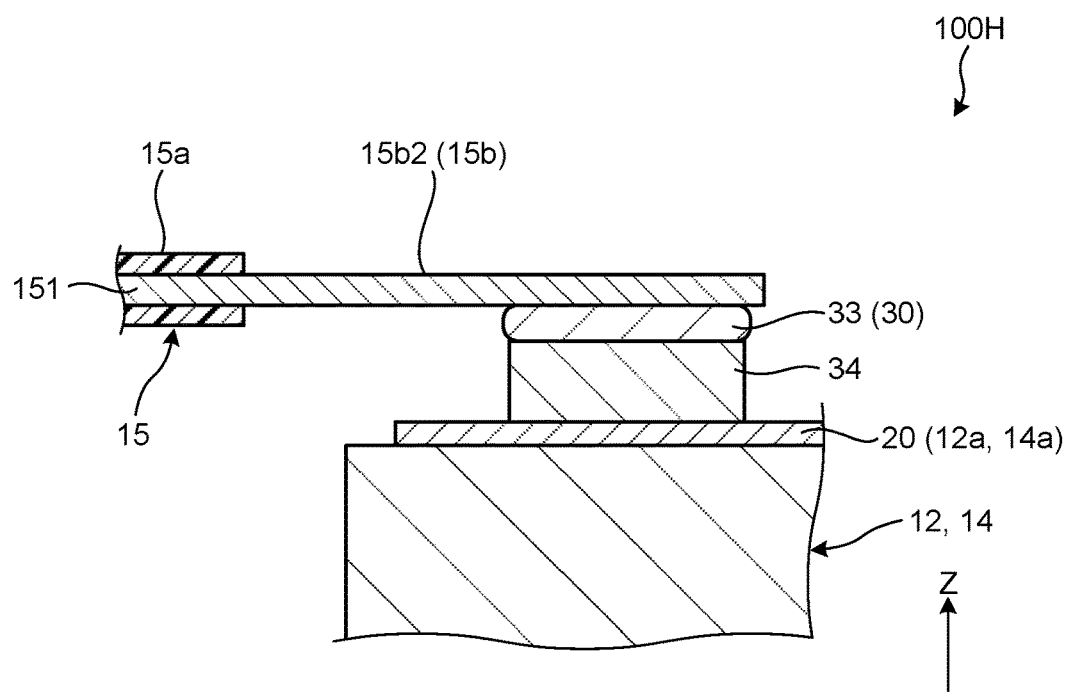
FIG. 13 is an exemplary and schematic sectional view of a part of an optical apparatus of an eighth embodiment.

FIG. 13 is a sectional view of a connection structure 100H of an eighth embodiment. The connection structure 100H of FIG. 13 can be incorporated into the optical apparatus 10 in place of the connection structure 100A of the first embodiment.

In the present embodiment, an inclusion 34 with conductivity is placed on the conductor part 20. The inclusion 34 can also be referred to as a conductive inclusion. For example, the inclusion 34 is a rigid body made of a highly conductive metallic material such as copper-based metal. The inclusion 34 can also be referred to as a post. The inclusion 34 is mechanically and electrically connected to the conductor part 20, by soldering, brazing, welding, and the like. The conductive wire 151 of the arm part 15b is mechanically and electrically connected to the inclusion 34 via the bonding material 33. The conductive wire 151 and the conductor part 20 are mechanically and electrically connected via the bonding material 33 and the inclusion 34. Even with such a configuration, it is possible to obtain the same effects as those in the embodiments described above.

Ninth Embodiment

Figure 14:
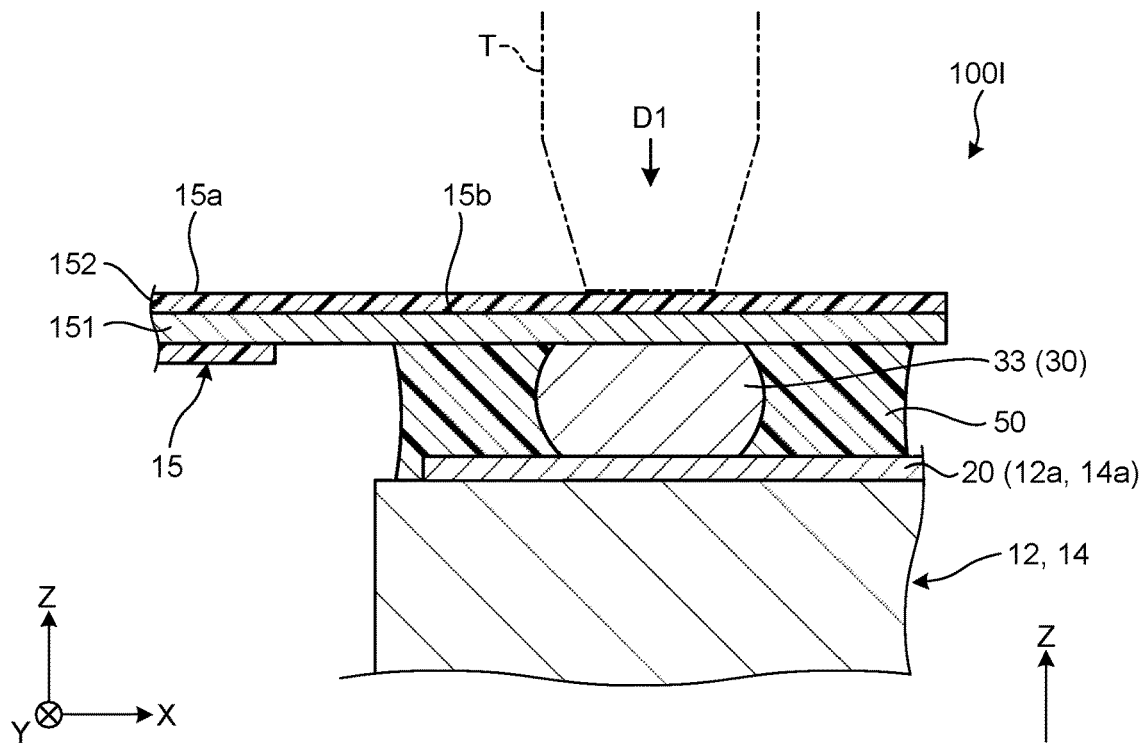
FIG. 14 is an exemplary and schematic sectional view of a part of an optical apparatus of a ninth embodiment.

FIG. 14 is a sectional view of a connection structure 100I of a ninth embodiment. The connection structure 100I of FIG. 14 can be incorporated into the optical apparatus 10 in place of the connection structure 100A of the first embodiment.

In the present embodiment, between the conductive wire 151 and the conductor part 20, the periphery of the bonding material 33 is covered by an auxiliary member 50. For example, the auxiliary member 50 is made of a thermosetting synthetic resin material with insulating properties. The auxiliary member 50 is applied in a fluid state after the bonding material 33 is disposed. Then, when the conductive wire 151 and the conductor part 20 are pressurized in an arrow D1 direction while being heated via a tool T so that the conductive wire 151 and the conductor part 20 come close to each other in the Z direction, the bonding material 33 is interposed between the conductive wire 151 and the conductor part 20 in a close contact state. Also, the auxiliary member 50 is interposed between the conductive wire 151 and the conductor part 20 in a close contact state while covering the periphery of the bonding material 33 (heating and compression process). During this heating and compression process, the auxiliary member 50 is solidified. Then, by being cooled, the bonding material 33 is solidified. Consequently, the conductive wire 151 and the conductor part 20 are mechanically and electrically connected by the bonding material 33 (cooling process).

With such a configuration, for example, the auxiliary member 50 can advantageously strongly maintain the mechanical and electrical connection state between the conductive wire 151 and the conductor part 20 via the bonding material 33, and advantageously improve the protection properties of the bonding material 33.

Tenth Embodiment

Figure 15:
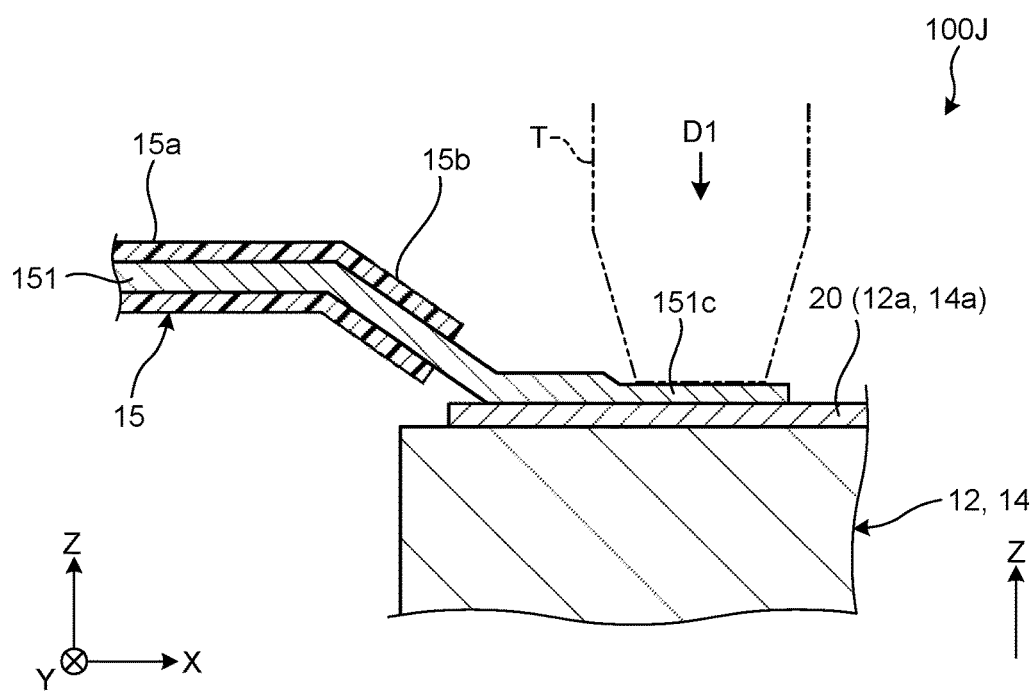
FIG. 15 is an exemplary and schematic sectional view of a part of an optical apparatus of a tenth embodiment.

FIG. 15 is a sectional view of a connection structure 100J of a tenth embodiment. The connection structure 100J of FIG. 15 can be incorporated into the optical apparatus 10 in place of the connection structure 100A of the first embodiment.

In the present embodiment, the conductive wire 151 and the conductor part 20 are mechanically, electrically, and directly connected, without interposing the bonding material 30 therebetween. For example, such a connection structure 100J can be obtained by applying the tool T, such as an ultrasonic tool, to a tip end portion 151c of the conductive wire 151, and by heating and pressurizing the tip end portion 151c. The thickness of the tip end portion 151c is thinner than the thickness of the general portion of the conductive wire 151, excluding the tip end portion 151c. With such a configuration, for example, it is possible to advantageously reduce the manufacturing labor and costs, to the extent that the bonding material 30 can be omitted.

While the embodiments of the present disclosure have been described above, the embodiments described above are merely examples and are not intended to limit the scope of the disclosure. The embodiments described above can be implemented in various other forms, and various omissions, substitutions, combinations, and changes may be made without departing from the gist of the disclosure. Moreover, specifications of each configuration, shape, and the like (structure, type, direction, model, size, length, width, thickness, height, number, arrangement, position, material, and the like) may be implemented with appropriate modifications.

For example, in the embodiments described above and other forms, the arm part may be a first arm part that has a covered section and an exposed section, or may be a second arm part that only has an exposed section.

According to the present disclosure, it is possible to obtain an optical apparatus in which a flexible substrate is housed in a housing, and that has a novel and improved configuration.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical apparatus comprising:
a housing;
at least one component housed in the housing, the at least one component being configured to be energized and perform at least one of outputting light, receiving light, and changing a property of light;
a plurality of external connection conductors configured to penetrate through the housing; and
a flexible substrate housed in the housing, the flexible substrate including
an insulation layer,
a plurality of conductive wires each configured to perform at least one of
conduction between the component and the external connection conductors,
conduction between the external connection conductors, and
conduction between a plurality of the components each serving as the at least one component,
a base part in which the conductive wires are covered by the insulation layer, and
a plurality of arm parts protruding and extending from the base part, each including one of the conductive wires.

2. The optical apparatus according to claim 1, wherein when viewed in a thickness direction of the flexible substrate, the arm parts include a plurality of arm parts extending in a first direction from the base part and aligned in a second direction intersecting the first direction with a gap therebetween.

3. An optical apparatus according to claim 1, wherein the arm parts include a first arm part having a covered section in which the conductive wire is covered by the insulation layer and an exposed section in which the conductive wire is exposed.

4. The optical apparatus according to claim 1, wherein the arm parts include a second arm part in which the conductive wire protrudes from the base part without being covered by the insulation layer.

5. The optical apparatus according to claim 1, wherein the arm parts include a plurality of arm parts with different lengths.

6. The optical apparatus according to claim 1, wherein the arm parts include an arm part in which the conductive wire and the external connection conductor or a terminal of the component are electrically connected via a conductive bonding material.

7. The optical apparatus according to claim 1, wherein the arm parts include an arm part in which the conductive wire and the external connection conductor or a terminal of the component are directly connected.

8. The optical apparatus according to claim 1, wherein the arm parts include an arm part in which an auxiliary member is provided to maintain an electric connection state between the conductive wire and the external connection conductor or a terminal of the component.

9. The optical apparatus according to claim 1, wherein the arm parts include a plurality of arm parts in which the conductive wire is electrically connected to the external connection conductor or a same terminal of the component.

* * * * *